(12) United States Patent
Park et al.

(10) Patent No.: US 6,268,106 B1
(45) Date of Patent: Jul. 31, 2001

(54) CHEMICALLY AMPLIFIED POSITIVE PHOTORESIST COMPOSITION

(75) Inventors: Joo-Hyeon Park; Dong-Chul Seo; Sun-Yi Park; Seong-Ju Kim, all of Taejeon (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 0 days.

(21) Appl. No.: 09/337,434

(22) Filed: Jun. 21, 1999

(30) Foreign Application Priority Data

Sep. 23, 1998 (KR) .................................................. 98-39372

(51) Int. Cl.[7] .................................................. G03F 7/004

(52) U.S. Cl. .................................................. 430/270.1

(58) Field of Search .................................................. 430/270.1

(56) References Cited

U.S. PATENT DOCUMENTS

| | | | |
|---|---|---|---|
| 5,843,624 | * 12/1998 | Houlihan et al. | 430/296 |
| 5,879,857 | * 3/1999 | Chandross et al. | 430/270.1 |
| 6,048,664 | * 4/2000 | Houlihan et al. | 430/270.1 |

FOREIGN PATENT DOCUMENTS

2332679 * 6/1999 (GB) .

OTHER PUBLICATIONS

Alicyclic Polymers for 193 nm Resist Applications, Okoro-anyanwu, U. et al., Chem. Mater. 1998, 10,3319–3327.*

* cited by examiner

Primary Examiner—Janet Baxter
Assistant Examiner—Rosemary Ashton
(74) Attorney, Agent, or Firm—Harrison & Egbert

(57) ABSTRACT

A chemical amplification positive amplification which can be formed into resist patterns much improved in transparency, photosensitivity and resolution and is suitable to KrF and ArF excimer lasers, enabling a submicrolithography process to be as exquisite as 0.2 μm or less. This composition is based on a copolymer of the formula I, ranging, in polystyrene-reduced weight average molecular weight, from 3,000 to 50,000 with a molecular weight distribution ($M_w/M_n$) of 1.0 to 2.0, and a low molecular weight compound of the formula VI:

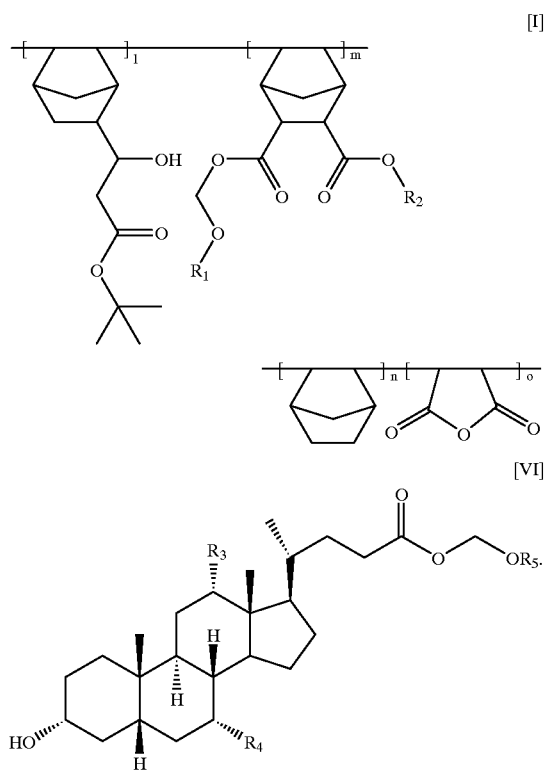

4 Claims, No Drawings

CHEMICALLY AMPLIFIED POSITIVE PHOTORESIST COMPOSITION

BACKGROUND OF THE INVENTION

1. Field of the Invention

The present invention relates to a chemical amplification positive photoresist composition. More particularly, the present invention relates to a chemical amplification positive photoresist composition, which makes it possible to perform a sub-micro lithography process using a deep UV such as a KrF excimer laser or an ArF excimer laser, an X ray such as synchrotron radiation, or charged particle beams such as electron beams.

2. Description of the Prior Art

The high integration of semiconductor devices has been partly, but critically based on a significant advance in lithography. For example, ultra-fine patterns as small as sub-microns, e.g. 0.2 microns or less, in size, are required for the fabrication of ultra-LSI. Now, the light sources used to form the fine patterns become increasingly shorter in wavelength, for example, from g-line or I-line, to deep UV light, including KrF excimer lasers and ArF excimer lasers, further to X-rays, and finally to electron beams.

With near UV light, such as g-line or I-line, which is used in conventional lithography, micro patterns as small as quarter microns (0.25 microns) are virtually impossible to realize. Such a micro pattern requires shorter wavelengths which belong to deep UV excimer lasers, X rays, and electron beams. Of them, KrF and ArF excimer lasers occupied the attention of the researchers in expressing such exquisiteness, and were developed as a light source, requiring novel photoresists. Now, chemical amplification photoresists are prevalently used for deep UV light.

A chemical amplification photoresist composition suitable for deep UV light fundamentally comprises a polymer with an acid-dissociable functional group, a compound which generates an acid (hereinafter referred to as "photoacid generator"), and a solvent, and avails itself of chemical amplification effect in lithography.

Most of the chemical amplification photoresists used for KrF excimer lasers are based on phenolic resins which, however, are found to be unsuitable for utilizing an ArF excimer laser because their aromatic rings absorb the light.

As an alternative, polyacrylate derivatives appeared to avoid such absorption. Polyacrylate derivatives show little absorbance at 193 nm, but suffer from a great disadvantage in that they are far inferior in dry etch resistance. Recently, much effort has been made to overcome the disadvantage, including the introduction of alicyclic derivatives into polyacrylate (Proc. SPIE, 1996, 2724, 365). The introduction of alicyclic derivatives certainly brings about an improvement in dry etch resistance, but causes a significant problem in a developing process because their hydrophobicity has a negative influence on the affinity for developing solutions.

It is known that copolymers of maleic anhydride and olefin can be used as matrix resins which show not only hydrophilicity, but also etch resistance. In the copolymers, maleic anhydride, responsible for hydrophilicity, serves as a promoter which enables the copolymerization with olefinic monomers to be accomplished at low temperatures at low pressures.

SUMMARY OF THE INVENTION

The present invention was developed during the processing of developing a base resin for photoresist, and resulted in the finding that carboxylic acid acts to increase the adherence of base polymer to substrate while hydrophobic groups play a role in restraining the solubility increase in basic solutions attributed to the carboxylic group and that the coexistence of the carboxyl group and hydrophobic group in a polymer brings about an improvement in adherence to substrate as well as controls the solubility in developing solutions.

Therefore, it is an object of the present invention to provide a copolymer which allows a photoresist superior in adherence to substrate and developability as well as in transparency to deep UV light, and dry etch resistance, photosensitivity and resolution.

It is another object of the present invention to provide a copolymer as a base resin for photoresist, with which there can be obtained patterns as fine as 0.2 $\mu$m.

It is a further object of the present invention to provide a chemical amplification positive photoresist composition containing the resin.

DETAILED DESCRIPTION OF THE INVENTION

In order to obtain patterns as fine as 0.2 microns by use of light as short in wavelength as ArF excimer laser, new chemical amplification photoresists have been being actively developed because previous ones did not give desirable patterns. For example, polyhydroxystyrene-based photoresists show a large absorbance at the wavelength of the light source (193 nm).

In forming 0.2 micron or less patterns, the adherence of a resist composition to a substrate plays an important role. Carboxylic acid was introduced into the side chains of matrix polymers for the purpose of increasing the adherence. Carboxylic acid-grafted matrix polymers, however, require a change in the basicity of developing solutions because the existence of carboxylic acid alters the solubility of the matrix polymers in the aqueous alkaline solutions.

In the polymer according to the present invention, a hydrophobic group-containing norbornene derivative is introduced into its main chain with the aim of controlling the adherence to substrates and the solubility in aqueous alkaline solutions while a cyclic group exists as a member of its main cain to enhance dry etch resistance.

Accordingly, the present invention provides a polymer for chemical amplification photoresist, having a repeating unit which comprises a norbornene moiety and a maleic anhydride moiety, and a chemical amplification photoresist composition based on the polymer.

More details are given of the present invention, below.

POLYMER

The polymer useful in the present invention has a repeat unit consisting of a norbornene, norbornene derivatives and a maleic anhydride. The polymer itself is insoluble or hard-soluble in aqueous alkaline solutions and contains at least one protecting group which can be dissociated by acid.

The alkali solubility of the polymer is primarily determined by the content of the acid functional groups which are dissociable by acid. Accordingly, the photoresist properties of the polymer, including adherence to substrate, photosensitivity, resolution and the like, can be controlled by the kind and quantity of the norbornene derivatives used in the polymer.

The polymer of the present invention is a multi-membered copolymer represented by the following general formula I:

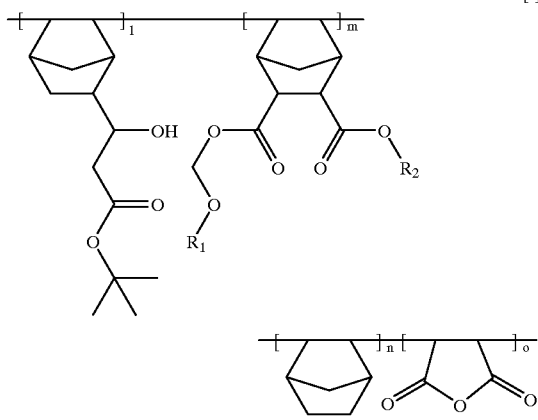

[I]

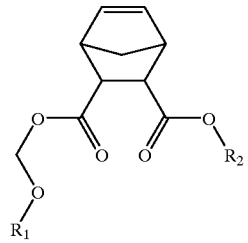

[V]

wherein,

R₁ and R₂ are independently selected from the group consisting of straight or branched alkyl groups, cyclic alkyl groups, polycyclic (bi, tri) alkyl groups, and alkoxyalkyl groups, all containing 1–10 carbon atoms, which are exemplified by methyl, ethyl, t-butyl, iso-propyl, cyclohexyl, adamantyl, bicyclo[2,2,1]heptane methyl and the like; and l, m, n and o each are a repeating number not more than 0.5, satisfying the condition that l+m+n+o=1 and $0.4 \leq o \leq 0.5$. The photoresist properties, such as adherence to substrate, photosensitivity and resolution, are taken into account in determining the repeating numbers, l, m and n.

The repeating unit of the Formula I can be prepared by polymerizing a maleic anhydride of the following structural formula II, a norbornene of the following structural formula III, and norbornene derivatives represented by the following general formulas IV and V:

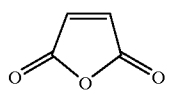

[II]

[III]

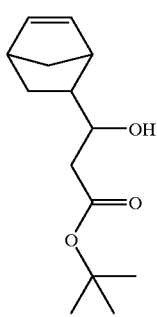

[IV]

wherein R₁ and R₂ are independently selected from the group consisting of straight or branched alkyl groups, cyclic alkyl groups, polycyclic (bi, tri) alkyl groups, and alkoxyalkyl groups, all containing 1–10 carbon atoms, which are exemplified by methyl, ethyl, t-butyl, iso-propyl, cyclohexyl, adamantyl, bicyclo[2,2,1]heptane methyl and the like.

The photoresist polymer according to the present invention may be a quar-polymer or ter-polymer. As far as quar-polymer, the monomers represented by the formulas II, III, IV and V all participate in copolymerization. For the terpolymer, the monomers represented by the formulas II, IV and V are used for the polymerization. Account must be taken of the adherence to substrate when determining the amount of the monomer represented by the structural formula IV.

The ter- or quar-polymers represented by the general formula I may be in the form of a block copolymer, a random copolymer or a graft copolymer. They may be prepared in conventional polymerization processes and, preferably by the action of a radical initiator. For this radical polymerization, an available initiator may be azobisisobutyronitrile (AIBN), benzoyl peroxide, lauryl oeroxide, azobisisocapronitrile, azobisisovaleronitrile, or t-butylhydroperoxide, but is not specifically limited to them. The polymerization of the monomers may be carried out in a manner of bulk polymerization, solution polymerization, suspension polymerization, bulk-suspension polymerization or emulsion polymerization. Examples of useful polymerization solvents include benzene, toluene, xylene, halogenobenzene, diethylether, tetrahydrofuran, esters, lactones, ketones, amides and mixtures thereof.

The temperature of the polymerization is dependent on the polymerization catalyst employed. For example, if azobisisobutyronitrile is used as a polymerization catalyst, the polymerization is preferably carried out at a temperature of about 60–90° C.

As for the molecular weight of the polymer prepared, it can be controlled by varying the amount of the polymerization initiator and the period of polymerization time. After completion of the polymerization, the monomer residues which remain unreacted in the reaction mixture, and by-products are preferably removed by solvent precipitation.

The polymer of the general formula I preferably has a polystyrene-reduced average molecular weight (hereinafter abbreviated to "$M_w$") ranging from about 1,000 to 100,000 and more preferably from about 3,000 to 50,000 when taking into account the sensitivity, developability, coatability and thermal resistance which are required for a photoresist. For example, if the polymer has an $M_w$ of less than 1,000, the resulting photoresist composition is very poor in coatability and developability. On the other hand, if the Mw exceeds 100,000, degradation occurs in sensitivity, resolution and developability. In molecular weight distribution (Mw/Mn), the polymer of the invention preferably ranges from 1.0 to 5.0 and more preferably from 1.0 to 2.0.

In the present invention, only one or a mixture of the polymers obtained may be used for the photoresist.

Photoresist patterns as fine as 0.2 microns can be usefully formed by use of the polymers of the present invention. Therefore, the present invention also pertains to a chemical amplification photoresist composition comprising the polymer, a photoacid generator and a low molecular weight compound which acts to promote the acid action of dissolving the polymer in an aqueous alkali developing solution as well as provides etch resistance for the polymer.

PHOTOACID GENERATOR

As the photoacid generator useful in the present invention, an onium salt, such as iodonium, sulfonium, phosphonium, diazonium and pyridonium, will suffice. Concrete, particularly effective, but non-limitative examples of the onium salt include triphenylsulfonium triflate, diphenyl(4-methylphenyl)sulfonium triflate, diphenyl(4-t-butylphenyl)sulfonium triflate, diphenyl(4-methoxyphenyl) sulfonium triflate, dibutyl(naphthalen-1-yl) sulfonium triflate, triphenylsulonium hexafluoroantimonate, diphenyliodonium triflate, diphenyliodonium methylbenzenesulfonate, bis(cyclohexylsulonyl) diazomethane, and bis(2,4-dimethylphenylsulfonyl) diazomethane. A halogen compound also can be used as the photoacid generator, which is exemplified by 1,1-bis(4-chlorophenyl)-2,2,2-tricholorethane, phenyl-bis (trichloromethyl)-s-triazine or naphthyl-bis (trichloromethyl)-s-triazine. Besides, diazoketone compounds, such as 1,3-diketo-2-diazo, diazobenzoquinone and diazonaphthoquinone, sulfonic compounds, sulfonic acid compounds, and nitrobenzyl compounds may be candidates for the photoacid generator. More preferable are the onium compounds and the diazoketone compounds. The photoacid generators may be used, singly or in combinations.

They may be used alone or in mixture of at least two species.

The photoacid generators are used at an amount of approximately 0.1–30 parts by weight based on 100 parts by weight of the solid content of the photoresist composition, and preferably at an amount of 0.3–10 parts by weight. For example, if too little photoacid generator is used, the photoresist becomes poor in sensitivity and developability. On the other hand, if the photoacid generator is used at an amount larger than 10 weight parts, degradation occurs in transparency to radiation, making it possible to form sharp rectangular resist patterns.

LOW MOLECULAR WEIGHT COMPOUND

In the present invention, there is recruited a low molecular weight compound which is decomposed by acid to promote the dissolution of the photoresist in an aqueous alkali developing solution as well as provides the polymer with etch resistance. By virtue of these activities of the low molecular weight compound, the chemical amplification positive photoresist of the present invention is much improved in contrast and can be formed into resist patterns whose side walls are of superior perpendicularity.

As the low molecular compound, there are suggested alicyclic derivatives represented by the following general formula VI:

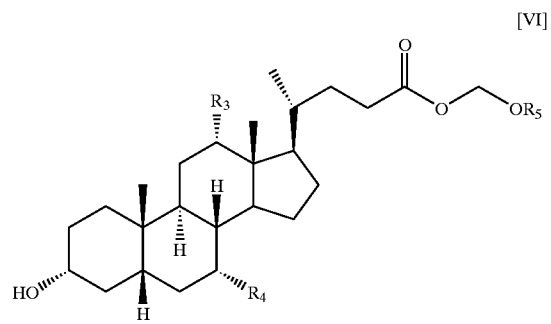

wherein $R_3$ and $R_4$ independently represent a hydrogen atom and a hydroxyl group; $R_5$ is a low alkyl group, a bicyclo[2,2,1]heptane (norbornene)-containing alkyl group, adamantane-containing alkyl group or bicyclo[4,4,0]decane (decalin)-containing alkyl group.

These low molecular weight compound may be used alone or in combinations.

Upon formulation, they may be added at an amount of approximately 1–50 parts by weight based on 100 parts by weight of the solid content of the photoresist composition, and preferably approximately 5–30 parts by weight. For example, if the low molecular weight compound is added at an amount greater than 50 parts by weight, the resulting photoresist is poor in adherence to substrate.

Optionally, the photoresist composition of the present invention may comprise additives, such as a surfactant, an azo compound, a halation inhibitor, an adhesive aid, a cpeservation stabilizer, an antifoaming agent and the like. As for surfactant, it may be exemplified by polyoxylauryl ether, polyoxystearyl ether, polyoxyethylene oleyl ether, polyethyleneglycol dilaurylate, etc. The surfactant is Preferably used at an amount of 2 parts by weight or less based on 100 parts by weight of the solid content of the photoresist composition.

When being exposed to light, the photoacid generator, as implied in its name, generates acid. Because the acid plays a great role in determining the sensitivity of the photoresist, it is needed to prevent its diffusing. For this purpose, a base additive may be used. Amine or ammonium compounds may be used. Useful is triphenyl amine or tetramethylammonium hydroxide. It is preferable that the base compound is used at an amount of approximately 0.05–5 parts by weight based on the total solid content. For example, if the base compound is added at an amount more than the upper limit, the diffusion of the acid is reduced, but the sensitivity is lowered.

To obtain a uniform and flat photoresist coating, the solvent used is required to show an appropriate evaporation rate and viscosity. Examples of such a solvent include ethyleneglycol monomethyl ether, ethyleneglycol monoethyl ether, ethyleneglycol monopropyl ether, methylcellosolve acetate, ethylcellosolve acetate, propyleneglycol monomethyl ether acetate, propyleneglycol monoethyl ether acetate, propyleneglycol monopropyl ether acetate, methylethyl ketone, cyclohexanone, methyl 2-hydroxypropionate, ethyl 2-hydroxypropionate, 2-heptanone, ethyl lactate, and gamma-butyrolacetone. They, if necessary, may be used, alone or in combinations. Depending on its physical properties, such as volatility and viscosity, the solvent is used at such an appropriate amount that a uniform and flat photoresist coating could be formed on a wafer.

A photoresist film is typically obtained by coating the photoresist solution on a wafer and drying it. After being filtered, the photoresist solution may be coated by use of a spin coating, flow coating or roll coating technique.

Then, selective irradiation on the photoresist film coated is performed to give fine patterns. The available radiation, although it is not specifically limited, may be UV light, such as i-line, deep UV light, such as KrF or ArF excimer lasers, X rays, or charged particle beams, such as electron beams, depending on the photoacid generator used. Following the radiation, a thermal treatment may be optionally done to improve the sensitivity of the film.

Generally, the formation of photoresist pattern is finally completed in a developing solution. Examples of the developing solution include aqueous solutions of sodium hydroxide, potassium hydroxide, sodium carbonate, sodium silicate, sodium metasilicate, ammonia water, ethyl amine, n-propyl amine, triethyl amine, tetramethylammonium hydroxide and tetraethylammonium hydroxide with particular preference to tetramethylammonium hydroxide. If necessary, additives, such as surfactants and aqueous alcohols, may be added.

A better understanding of the present invention may be obtained in light of the following examples which are set forth to illustrate, but are not to be construed to limit the present invention.

SYNTHESIS OF LOW MOLECULAR WEIGHT COMPOUNDS AND MONOMERS-SYNTHESIS OF LOW MOLECULAR WEIGHT COMPOUNDS

Synthesis Example I 30.1 g of lithocholic acid was dissolved in dimethyl acetamide and added with 7.7 g of chloromethyl methyl ether. After being cooled to 0° C., the reaction solution was slowly added with 12.1 g with stirring. At the same temperature, this reaction solution was allowed to be reacted for 1 hour by stirring. Thereafter, the solution was diluted with ethyl ether and washed with an aqueous $Na_2CO_3$ solution and distilled water. The organic layer thus formed was separated, dried over magnesium sulfate and filtered to allow 28.3 g of the molecular weight compound represented by the following structural formula I:

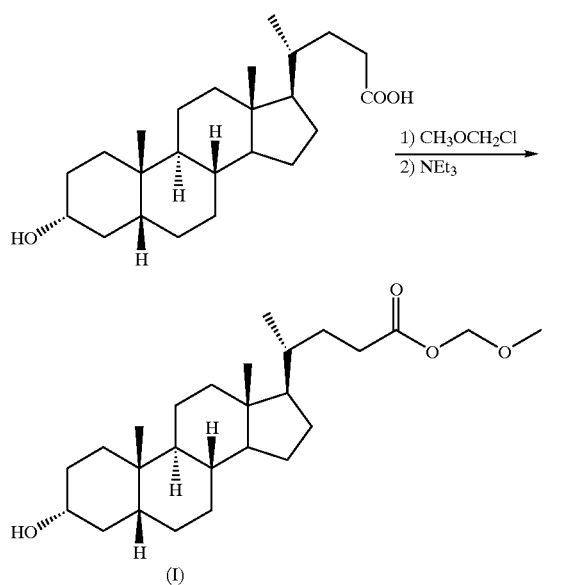

In the above formula, $NET_3$ is an abbreviation for triethylamine $((C_2H_5)_3N)$.

Synthesis Example 2

The same procedure as in Synthesis Example 1 was repeated, except for using, instead of 30.1 g of lithocholic acid, 31.4 g of deoxycholic acid, to obtain 30.4 g of the low molecular weight compound represented by the following structural formula II.

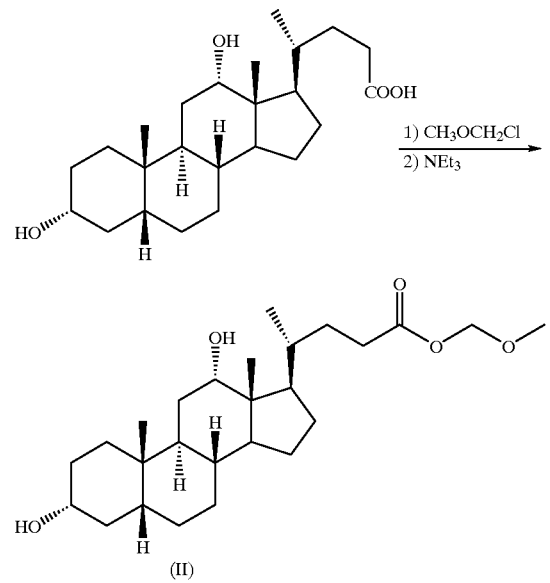

Synthesis Example 3

The same procedure as in Synthesis Example 1 was repeated, except for using, instead of 30.1 g of lithocholic acid, 32.7 g of deoxycholic acid, to obtain 28.2 g of the low molecular weight compound represented by the following structural formula III.

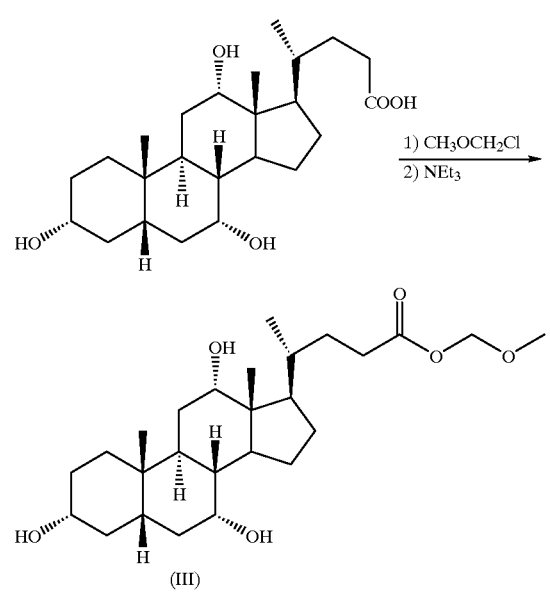

Synthesis Example 4

The same procedure as in Synthesis Example 1 was repeated, except for using, instead of 7.7 g of chloromethyl methyl, 12.7 g of 2-(chloromethoxymethyl)bicyclo[2,2,1]heptane, to obtain 29.1 g of the low molecular weight compound represented by the following structural formula IV.

methyl, 11.7 g of 2-(chloromethoxy)bicyclo[2,2,1]heptane, to obtain 30.5 g of the low molecular weight compound represented by the following structural formula VI.

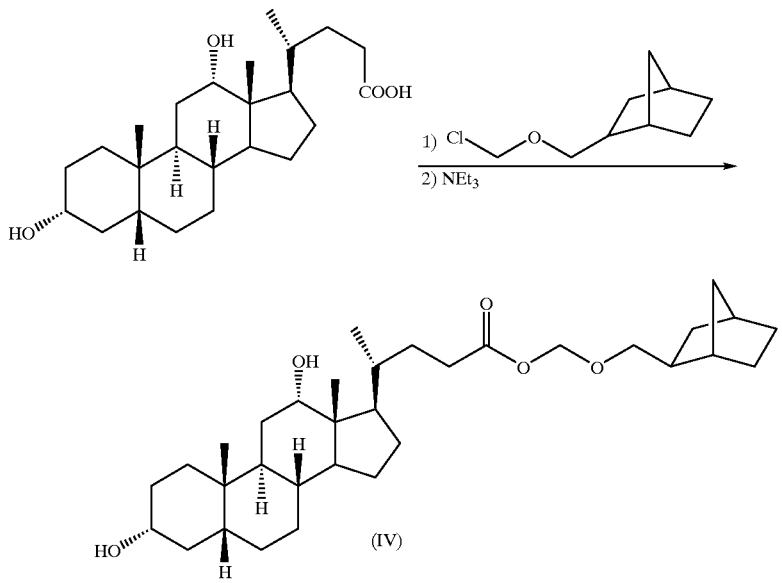

Synthesis Example 5

The same procedure as in Synthesis Example 1 was repeated, except for using, instead of 7.7 g of chloromethyl methyl, 13.8 g of 2-(chloromethoxymethyl)-3-methyl-bicyclo[2,2,1]heptane, to obtain 31.4 g of the low molecular weight compound represented by the following structural formula V.

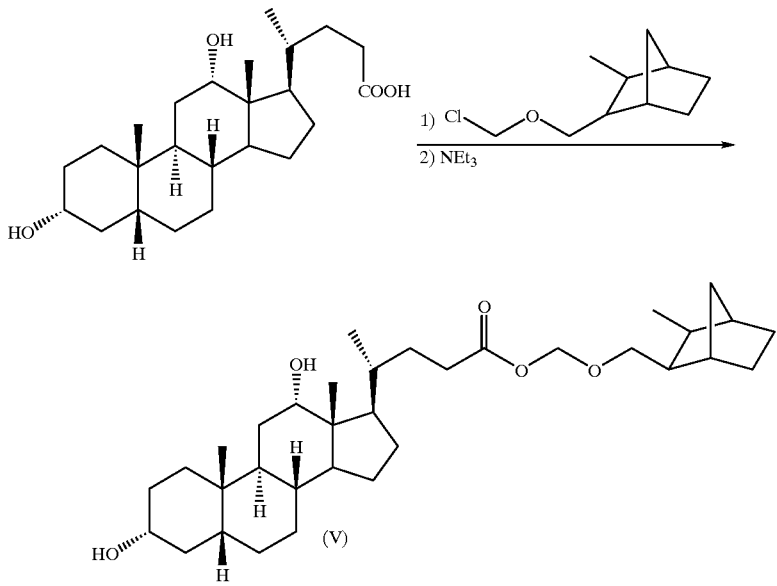

Synthesis Example 6

The same procedure as in Synthesis Example 1 was repeated, except for using, instead of 7.7 g of chloromethyl

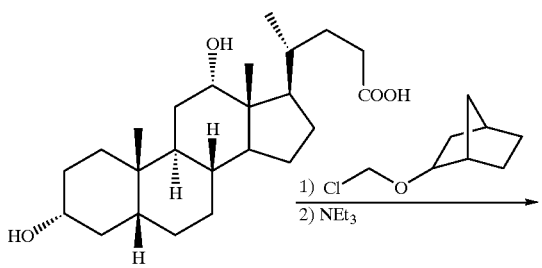

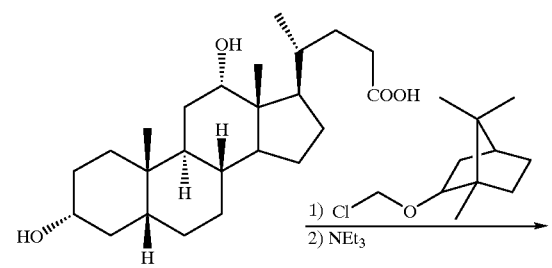

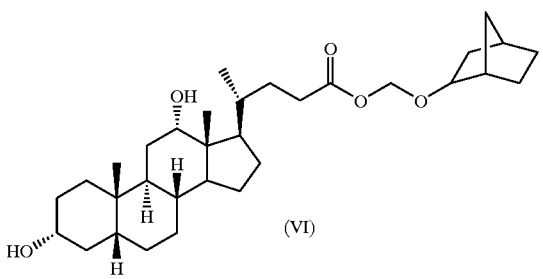

Synthesis Example 7

30.1 g of lithocholic acid was reacted with 14.8 g of 2-chloromethoxy-1,7,7-trimethyl-bicyclo[2,2,1]heptane in a similar manner to that of Synthesis Example 1, to yield 29.4 g of the low molecular weight compound represented by the following structural formula VII.

Synthesis Example 8

30.1 g of lithocholic acid was reacted with 14.8 g of 2-chloromethoxy-decahydronaphthalene in a similar manner to that of Synthesis Example 1, to yield 29.4 g of the low molecular weight compound represented by the following structural formula VIII.

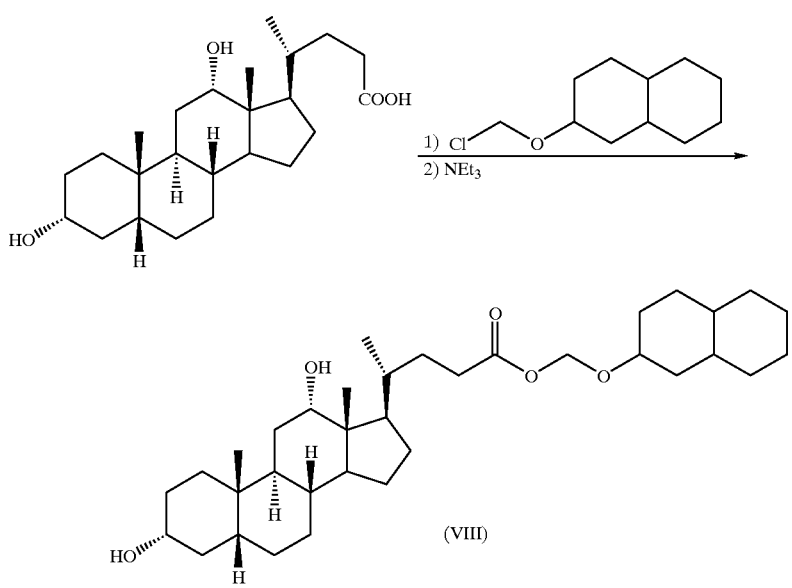

—SYNTHESIS OF MONOMERS—

Synthesis Example 9

In a four-necked flask equipped with a stirrer and a reflux condenser were placed 50 g of a Zn—Cu couple and 90 ml of tetrahydrofuran, followed by slowly charging a solution of 53 ml of t-butyl bromoacetate and 36 ml of 5-norbornen-2-carboxyaldehyde in 180 ml of tetrahydrofuran. After completion of the charging, the solution was subjected to reflux at 70° C. for 2 hours and then, cooled to room temperature. The Zn—Cu couple was filtered off, after which the solution was washed and extracted with a solvent and distilled under vacuum to give 39 g of the monomer represented by the following structural formula M-I.

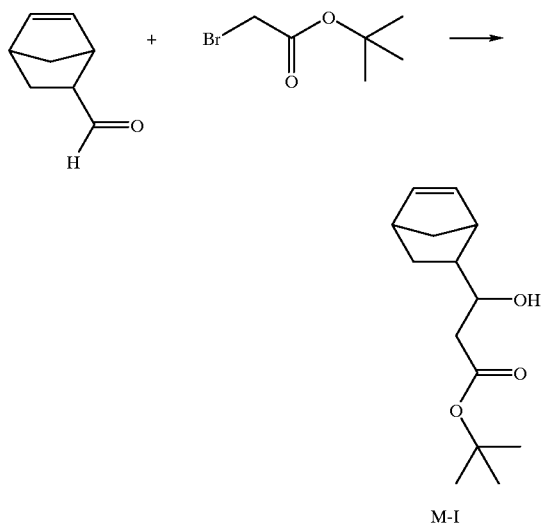

M-I

Synthesis Example 10

67 g of cis-5-norbornen-endo-2,3-dicarboxylic anhydride and 50 g of diphenylaminopyridine were dissolved in 154 ml of t-butanol and stirred for 15 hours at 80° C. After being neutralized with excess 5% aqueous HCl solution, the reaction mixture was extracted with ethyl acetate and dried over is magnesium sulfate. Vacuum distillation was done to completely remove the solvent, producing 91 g of the monomer represented by the structural formula M-II.

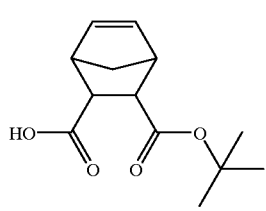

M-II

Synthesis Example 11

50 g of the monomer M-II were dissolved in dichloromethane, together with 19 ml of chloromethyl methyl ether and then, stepwise added with 35 ml of triethyl amine at 0° C. In the presence of this basic catalyst, the reactants were allowed to react by stirring for 5 hours at room temperature. The reaction mixture was washed with an aqueous potassium carbonate solution and distilled water. The organic layer thus formed was isolated and dried over magnesium sulfate, and the complete removal of the solvent yielded 49 g of the monomer represented by the following structural formula M-III.

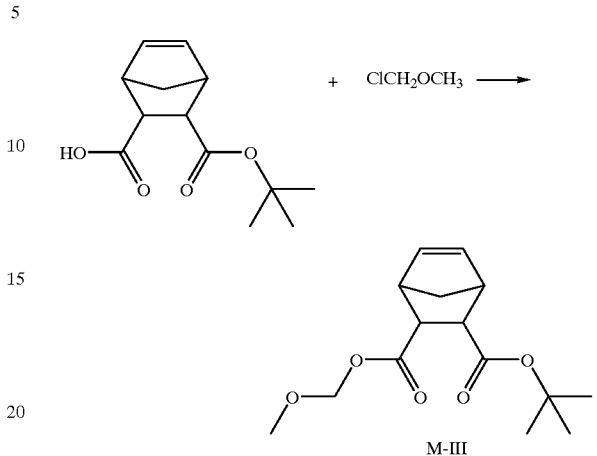

M-III

Synthesis Example 12

50 g of 5-norbornen-2,3-dicarboxyl anhydride and 37.9 g of norbornanemethanol were dissolved in dimethyl acetamide and reacted at 80° C. for 15 hours in the presence of 44 g of 4-dimethylaminopyridine while stirring. After completion of the reaction, the solution was cooled to room temperature and neutralized with conc. hydrochloric acid. This neutralized reaction was diluted in ethyl ether and washed three times with distilled water. The organic layer obtained was dried over magnesium sulfate and filtered to give 65 g of the compound represented by the following structural formula M-IV.

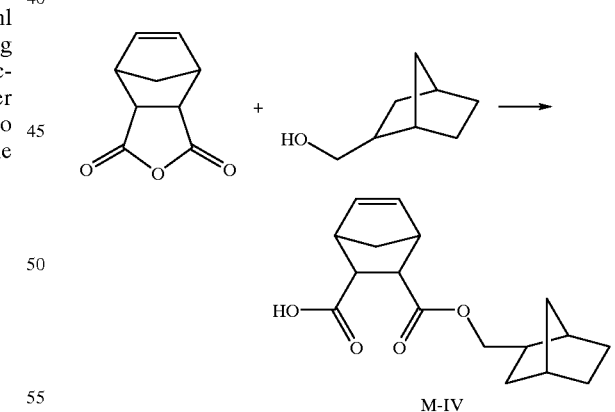

M-IV

Synthesis Example 13

From, instead of 30.1 g of lithocholic acid, 23.2 g of the monomer M-IV synthesized in Synthesis Example 12, 20.7 g of the monomer M-V represented by the following structural formula were prepared in a similar manner to that of Synthesis Example 1.

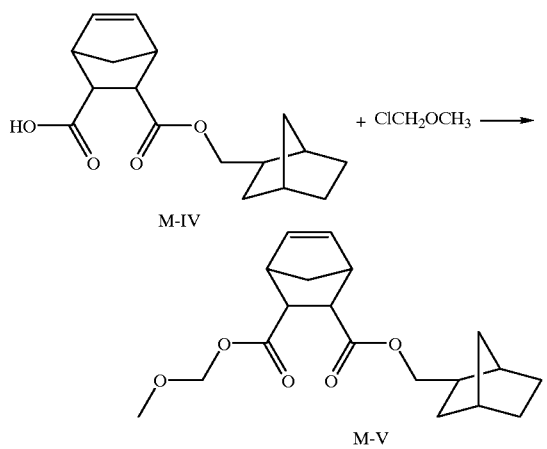

M-IV

M-V

Synthesis Example 14

The same procedure as in Synthesis Example 1 was repeated except for using, instead of 30.1 g of lithocholic acid, 26.8 g of the monomer M-IV synthesized in Synthesis Example 12 and, instead of 7.7 g of chloromethyl methyl ether, 12.7 g of 2-(chloromethoxymethyl)-bicyclo[2,2,1]heptane, to yield 26.2 g of the monomer represented by the following structural formula M-VI.

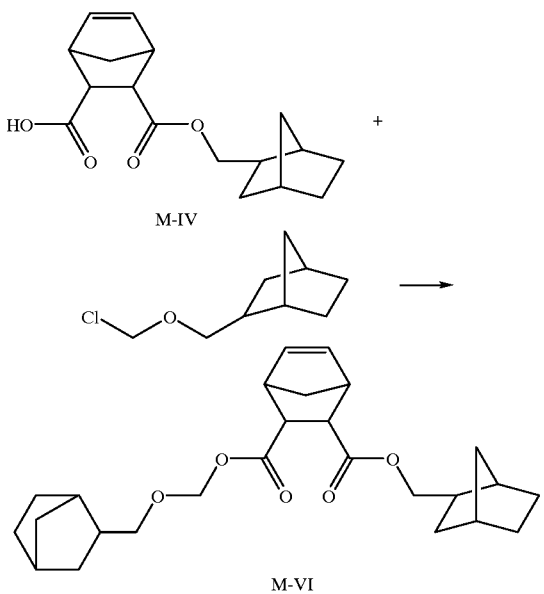

M-IV

M-VI

SYNTHESIS OF POLYMERS

Polymerization Example 1

In a two-necked, round-bottomed flask equipped with a stirrer and a reflux condenser, 7.15 g of the monomer M-I synthesized in Synthesis Example 9, 4.91 g of maleic anhydride, and 1.89 g of norbornene were charged, together with 27.87 g of toluene and 0.82 g of AIBN. Under an argon atmosphere, the solution was well mixed by stirring for 2 hours at room temperature. Polymerization was initiated by activating the initiator at 70° C. At 20 hours after the polymerization, the reaction was cooled to room temperature. This polymerized solution was diluted with tetrahydrofuran and added to excess methanol/distilled water (4:1) to give precipitates. They were filtered and the filtrate was washed several times with the same mixed solvent and dried in vacuo to yield 10.34 g of the polymer represented by the following structural formula P-I (hereinafter referred to as "P-I resin"). It had a polystyrene-reduced weight average molecular weight of about 6,900.

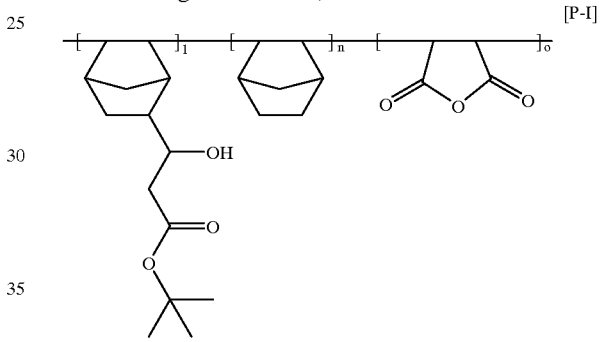

[P-I]

Polymerization Example 2

The procedure of Polymerization Example I was repeated using 5.72 g of the monomer M-I synthesized in Synthesis Example 9, 4.90 g of maleic anhydride, 2.82 g of norbornene and 0.60 g of the monomer M-II synthesized in Synthesis Example 10, together with 0.82 g of AIBN as a polymerization initiator and 31.18 g of toluene as a solvent, to allow 8.82 g of the polymer represented by the following structural formula P-II (hereinafter referred to as "P-II resin"). This polymer was 7,500 in polystyrene-reduced weight average molecular weight.

[P-II]

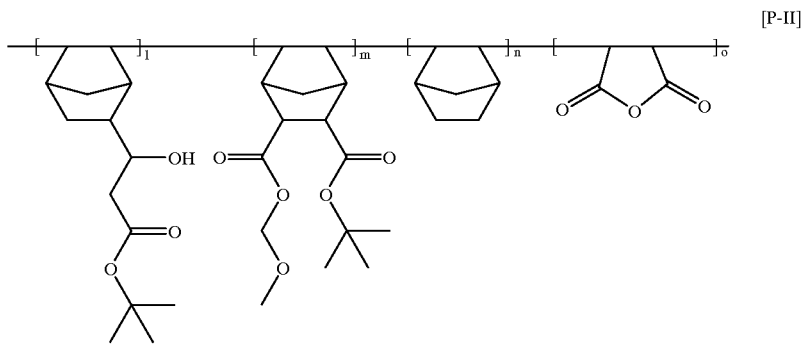

Polymerization Example 3

Polymerization was carried out in a similar manner to that of Polymerization Example I, using 4.77 g of the monomer M-I, 4.90 g of maleic anhydride, 2.35 g of norbornene and 1.41 g of the monomer M-III synthesized in Synthesis Example 11, together with 0.82 g of AIBN and 28.87 g of toluene, to allow 9.04 g of the polymer represented by the following structural formula P-III (hereinafter referred to as "P-III resin"). This polymer was 6,300 in polystyrene-reduced weight average molecular weight.

Polymerization Example 5

1.45 g of norbornene, 4.90 g of maleic anhydride and 15.04 g of the monomer M-V synthesized in Synthesis Example 13 were polymerized in the presence of 0.49 g of AIBN in 32.10 g of ethyl acetate in a similar manner to that of Polymerization Example 4, to allow 12.85 g of the polymer represented by the following structural formula P-V (hereinafter referred to as "P-V"), with a polystyrene-reduced weight average molecular weight of 7,000.

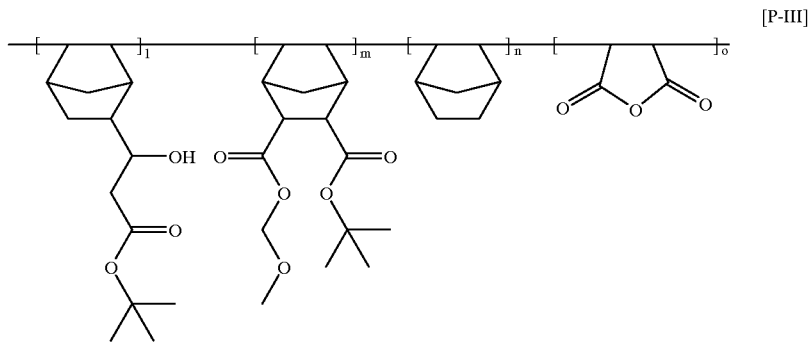

[P-III]

Polymerization Example 4

In a two-necked, round-bottomed flask equipped with a stirrer and a reflux condenser, 2.38 g of the monomer M-I synthesized in Synthesis Example 9, 4.90 g of maleic anhydride, 1.45 g of norbornene and 11.70 g of the monomer M-V synthesized in Synthesis Example 13, were charged, together with 0.82 of AIBN as a polymerization initiator and 40.88 g of ethyl acetate as a reaction solution. Under an argon atmosphere, the solution was well mixed by stirring for 2 hours at room temperature. While maintaining the reaction temperature at 65° C., polymerization was carried out for 20 hours. After completion of the polymerization, the reaction was cooled to room temperature. This polymerized solution was diluted with tetrahydrofuran and added in excess isopropyl alcohol, to give precipitates. They were filtered and the filtrate was washed several times with the same mixed solvent and dried in vacuo to yield 13.05 g of the polymer represented by the following structural formula P-IV (hereinafter referred to as "P-IV resin"). It had a polystyrene-reduced weight average molecular weight of about 6,200.

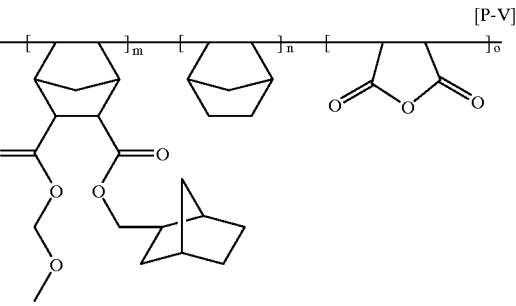

[P-V]

Polymerization Example 6

1.45 g of norbornene, 4.90 g of maleic anhydride and 19.29 g of the monomer M-Vi synthesized in Synthesis Example 14 were polymerized in the presence of 0.49 g of AIBN in 38.46 g of ethyl acetate in a similar manner to that of Polymerization Example 4, to allow 15.89 g of the

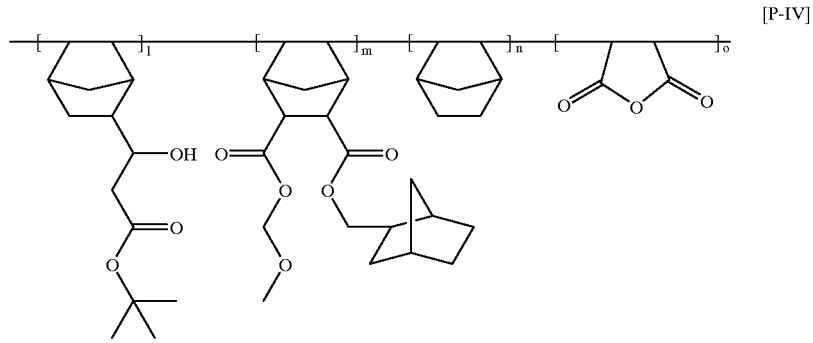

[P-IV]

polymer represented by the following structural formula P-VI (hereinafter referred to as "P-VI"), with a polystyrene-reduced weight average molecular weight of 6,300.

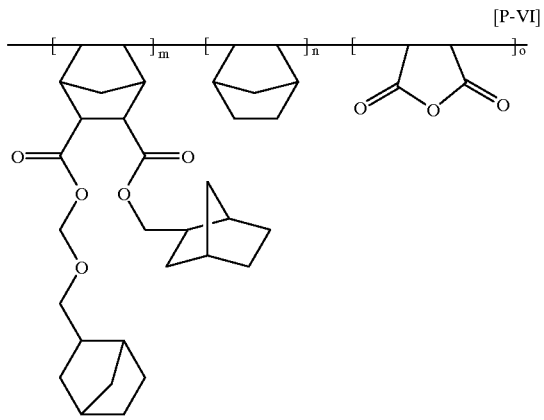

[P-VI]

RESIST FORMULATION AND ASSAY

Example 1

100 weight parts of the resin P-I obtained in Polymerization Example 1 were dissolved, along with 10 weight parts of the low molecular weight compound obtained in Synthesis Example 1 and 1.6 weight parts of diphenyl(4-methylphenyl)sulfonium triflate, in 540 weight parts of propyleneglycol methyl ether acetate and the solution was filtered through a 0.2 μm membrane filter.

The photoresist solution thus obtained was coated on a substrate by use of a spinner and dried at 110° c. for 90 sec, to form a coating 0.6 μm thick. This coating was exposed through a pattern chrome mask to light in an ArF excimer laser steper while the diphenyl(4-methylphenyl)sulfonium triflate served as a photoacid generator and then, baked at 130° C. for 90 sec. Subsequently, the exposed coating was immersed in an aqueous 2.38 wt % tetramethylammonium hydroxide solution for 60 sec for development, washed with pure water and dried to form a photoresist pattern. This pattern was found to be good in adherence to substrate and developability and was 0.14 μm wide. This resolution was obtained at an exposure energy of 20 mJ/cm$^2$ and the pattern was almost rectangular in cross sectional shape, but some acid diffusion occurred.

Comparative Example 1

100 weight parts of the resin P-I obtained in Polymerization Example 1 were dissolved, along with 1.6 weight parts of diphenyl(4-methylphenyl)sulfonium triflate, in 540 weight parts of propyleneglycol methyl ether acetate. This coating solution was formed into a resist pattern in the same manner as in Example 1, except for not using the low molecular weight compound. The resist pattern was a line-and-space pattern 0.15 μm wide. This resolution was obtained at an exposure energy of 20 mJ/cm$^2$. Good as it is in adherence to substrate, the pattern had a roundish side wall.

Example 2

100 weight parts of the resin P-I obtained in Polymerization Example 1 were dissolved, along with 10 weight parts of the low molecular weight compound obtained in Synthesis Example 1 and 1.6 weight parts of diphenyl(4-methylphenyl)sulfonium triflate, in 540 weight parts of propyleneglycol methyl ether acetate. This coating solution was formed into a resist pattern in the same manner as in Example 1, except that the solution was further added with methylammonium hydroxide. The resist pattern was a line-and-space pattern 0.14 μm wide with a clear rectangular cross section, which was free of the influence of standing waves. It was found to be good in adherence to substrate and developability. The exposure energy was 24 mJ/cm$^2$.

Example 3

100 weight parts of the resin P-I obtained in Polymerization Example 1 were dissolved, along with 10 weight parts of the low molecular weight compound obtained in Synthesis Example 2 and 1.6 weight parts of diphenyl(4-methylphenyl)sulfonium triflate, in 540 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 20 mJ/cm$^2$.

Example 4

100 weight parts of the resin P-II obtained in Polymerization Example 2 were dissolved, along with 10 weight parts of the low molecular weight compound obtained in Synthesis Example 2 and 1.6 weight parts of diphenyl(4-methylphenyl)sulfonium triflate, in 550 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 16 mJ/cm$^2$.

Example 5

100 weight parts of the resin P-III obtained in Polymerization Example 3 were dissolved, along with 10 weight parts of the low molecular weight compound obtained in Synthesis Example 1 and 1.6 weight parts of diphenyl(4-methylphenyl)sulfonium triflate, in 550 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 14 mJ/cm$^2$.

Example 6

100 weight parts of the resin P-IV obtained in Polymerization Example 4 were dissolved, along with 10 weight parts of the low molecular weight compound I obtained in Synthesis Example 1 and 1.6 weight parts of diphenyl(4-methylphenyl)sulfonium triflate, in 500 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a roundish, but relatively clear rectangular cross section, which was free of the influence of standing waves. It was found to be good in adherence to substrate and developability. The exposure energy was 12 mJ/cm$^2$.

Example 7

100 weight parts of the resin P-V obtained in Polymerization Example 5 were dissolved, along with 10 weight parts of the low molecular weight compound II obtained in Synthesis Example 2 and 1.6 weight parts of diphenyl(4-methylphenyl)sulfonium triflate, in 540 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 13 mJ/cm$^2$.

Example 8

100 weight parts of the resin P-VI obtained in Polymerization Example 6 were dissolved, along with 10 weight parts of the low molecular weight compound II obtained in Synthesis Example 2 and 1.6 weight parts of diphenyl(4-methylphenyl)sulfonium triflate, in 500 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 15 mJ/cm$^2$.

Example 9

100 weight parts of the resin P-III obtained in Polymerization Example 3 were dissolved, along with 10 weight parts of the low molecular weight compound II obtained in Synthesis Example 2 and 1.6 weight parts of diphenyl(4-methylphenyl)sulfonium triflate, in 500 weight parts of propyleneglycol methyl ether acetate. This coating solution was formed into a resist pattern in the same manner as in Example 1, except that the solution was further added with methylammonium hydroxide. The resist pattern was a line-and-space pattern 0.12 μm wide with a clear rectangular cross section, which was free of the influence of standing. waves. It was found to be good in adherence to substrate and developability. The exposure energy was 14 mJ/cm$^2$.

Example 10

100 weight parts of the resin P-III obtained in Polymerization Example 3 were dissolved, along with 10 weight parts of the low molecular weight compound III obtained in Synthesis Example 3 and 1.6 weight parts of diphenyl(4-methylphenyl)sulfonium triflate, in 500 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide. Good as it was in adherence to substrate and developability, the resist pattern had a roundish side wall. The exposure energy was 12 mJ/cm$^2$.

Example 11

100 weight parts of the resin P-ITI obtained in Polymerization Example 3 were dissolved, along with 10 weight parts of the low molecular weight compound IV obtained in Synthesis Example 4 and 1.6 weight parts of diphenyl(4-methylphenyl)sulfonium triflate, in 500 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 14 mJ/cm$^2$.

Example 12

100 weight parts of the resin P-III obtained in Polymerization Example 3 were dissolved, along with 10 weight parts of the low molecular weight compound V obtained in Synthesis Example 5 and 1.6 weight parts of diphenyl(4-Tethylphenyl)sulfonium triflate, in 550 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 16 mJ/cm$^2$.

Example 13

100 weight parts of the resin P-III obtained in Polymerization Example 3 were dissolved, along with 10 weight parts of the low molecular weight compound VI obtained in Synthesis Example 6 and 1.6 weight parts of diphenyl(4-methylphenyl)sulfonium triflate, in 500 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 14 mJ/cm$^2$.

Example 14

100 weight parts of the resin P-III obtained in Polymerization Example 3 were dissolved, along with 10 weight parts of the low molecular weight compound VII obtained in Synthesis Example 7 and 1.6 weight parts of diphenyl(4-methylphenyl)sulfonium triflate, in 500 weight parts of propyleneglycol methyl ether acetate. This coating solution was formed into a resist pattern in the same manner as in Example 1, except that the solution was further added with methylammonium hydroxide. The resist pattern was a line-and-space pattern 0.13 μm wide with a clear rectangular cross section, which was free of the influence of standing waves. It was found to be good in adherence to substrate and developability. The exposure energy was 17 mJ/cm$^2$.

Example 15

100 weight parts of the resin P-III obtained in Polymerization Example 3 were dissolved, along with 10 weight parts of the low molecular weight compound VIII obtained in Synthesis Example 8 and 1.6 weight parts of diphenyl(4- methylphenyl)sulfonium triflate, in 500 weight parts of propyleneglycol methyl ether acetate. This coating solution was formed into a resist pattern in the same manner as in Example 1, except that the solution was further added with methylammonium hydroxide. The resist pattern was a line-and-space pattern 0.14 μm wide with a clear rectangular cross section, which was free of the influence of standing waves. It was found to be good in adherence to substrate and developability. The exposure energy was 20 mJ/cm².

As described hereinbefore, the low molecular weight compound is decomposed by acid to promote the dissolution of the photoresist in an aqueous alkali developing solution as well as provides the polymer with etch resistance, thereby rendering the chemical amplification positive photoresist to be much improved in contrast and to be formed into resist patterns whose side walls are of superior perpendicularity.

In addition, the chemical amplification photoresist compositions according to the present invention can be easily controlled in sensitivity by regulating the content and kind of the norbornene derivatives in the matrix polymers in addition to being superior in adherence to substrate and dry etch resistance. With these advantages, the chemical amplification photoresist compositions can be formed into resist patterns much improved in transparency, photosensitivity and resolution. Consequently, the chemical amplification photoresist compositions of the present invention can be so useful in fabricating semiconductor devices, which are expected to be further miniaturized. Particularly, the photoresist compositions are suitable to KrF and ArF excimer lasers, enabling a submicrolithography process to be as exquisite as 0.2 μm or less.

Although the invention has been described in detail by referring to certain preferred embodiments, it will be understood that various modifications can be made within the spirit and scope of the invention. The invention is not to be limited except as set forth in the following claims.

What is claimed is:

1. A chemical amplification positive photoresist composition, comprising:

a copolymer, ranging in polystyrene-reduced weight average molecular weight from 3,000 to 50,000 with a molecular weight distribution ($M_w/M_n$) of 1.0 to 2.0, represented by the following general formula I:

[I]

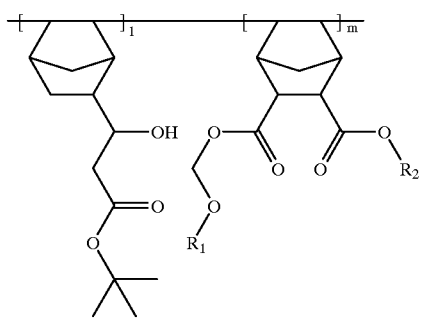

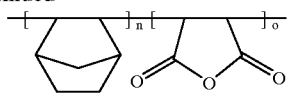

wherein, $R_1$ and $R_2$ are independently selected from the group consisting of straight or branched alkyl groups, cyclic alkyl groups, polycyclic (bi, tri) alkyl groups, and alkoxyalkyl groups, all containing 1–10 carbon atoms; and l, m, n and o each are a repeating number not more than 0.5, satisfying the condition that l+m+n+o=1 and $0.4 \leq o \leq 0.5$;

at least one low molecular weight compound, represented by the following general formula VI:

[VI]

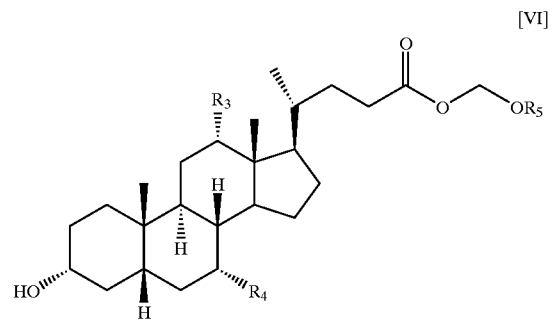

wherein $R_3$ and $R_4$ independently represent a hydrogen atom and a hydroxyl group; $R_5$ is a low alkyl group, a bicyclo[2,2,1]heptane (norbornene)-containing alkyl group, adamantane-containing alkyl group or bicyclo[4,4,0]decane (decalin)-containing alkyl group;

a photoacid generator; and a solvent.

2. The chemical amplification positive photoresist composition as set forth in claim 1, wherein l and m each range from 0 to 0.5 with $0.15 \leq l+m \leq 0.5$ and n ranges from 0 to 0.35.

3. The chemical amplification positive photoresist composition as set forth in claim 1, wherein the photoacid generator is used at an amount of approximately 0.3–10 weight parts based on 100 weight parts of the copolymer and a base additive is further added at an amount of approximately 0–30 weight parts based on the 100 weight parts of the photoacid generator.

4. The chemical amplification positive photoresist composition as set forth in claim 1, wherein the low molecular weight compound is used at an amount of approximately 5–30 weight parts based on 100 weight parts of the copolymer.

* * * * *